United States Patent
Suzuki et al.

[11] Patent Number: 5,977,633
[45] Date of Patent: Nov. 2, 1999

[54] SEMICONDUCTOR DEVICE WITH METAL BASE SUBSTRATE HAVING HOLLOWS

[75] Inventors: Katsunobu Suzuki; Hiroyuki Uchida, both of Tokyo, Japan

[73] Assignee: NEC Corporation, Tokyo, Japan

[21] Appl. No.: 09/086,600

[22] Filed: May 29, 1998

[51] Int. Cl.⁶ .................................................. H01L 23/48
[52] U.S. Cl. ........................ 257/738; 257/778; 257/779
[58] Field of Search ................................... 257/778, 779, 257/738, 739, 774

[56] References Cited

U.S. PATENT DOCUMENTS 5,668,405  9/1997  Yamashita ................................ 257/778
5,835,355  10/1998  Dordi ...................................... 257/738

FOREIGN PATENT DOCUMENTS 8-148608  6/1996  Japan .

OTHER PUBLICATIONS

H. Asakura, "Packaging Technology", Nikkei Microdevice, Jun. 1995, pp. 61–65.
"Area Array Packaging Seminar", TechSearch International, Inc., Dec. 1, 1995.
B. Levine et al., "The Package", Electronic News, Jan. 22, 1996, p. 48.

*Primary Examiner*—Carl Whitehead, Jr.
*Assistant Examiner*—Roy Potter
*Attorney, Agent, or Firm*—Young & Thompson

[57] ABSTRACT

In the manufacture of a semiconductor device, an insulator film is attached to the back surface of a metal base substrate, and over the insulator film a wiring pattern is formed. A silicon chip is loaded on the metal base substrate via a mount and is connected to the wiring pattern via bonding wires. Solder pads or bump contacts are formed on the wiring pattern; the metal base substrate is locally cut out at areas just above the solder bump contacts to form hollows. Finally the resulting wiring pattern is covered with a cover insulator film and the silicon chip is sealed with seal resin.

20 Claims, 6 Drawing Sheets

SEMICONDUCTOR DEVICE WITH METAL BASE SUBSTRATE HAVING HOLLOWS

BACKGROUND OF THE INVENTION

1. Field of the Invention

This invention relates to a semiconductor device called a BGA (ball grid array) and more particularly to such a semiconductor device using a metal base substrate.

2. Description of the Related Art

In recent years BGAS have been attracting the increasing attention of the semiconductor industry as they are advantageous in increasing the number of pins or prongs and in operating at a much higher speed as compared to QFP (quad flat package) type semiconductor devices, which have been a popular conventional technology. To the end various proposals have been made up to now. The following are examples of these proposed technologies.

FIG. 12 of the accompanying drawings is a schematic cross-sectional view of a conventional semiconductor device called SBGAS (superBGA) disclosed in "ELECTRONIC NEWS Jan. 22, 1996", pp. 48 (an article entitled "The Package" and written by B. Levine and F. Guinther). This known technology is hereinafter called the first conventional art.

In the first conventional art, as shown in FIG. 12, a metal ring 812 is stuck to the back (or lower) surface of a metal substrate 801 with insulative or conductive adhesive. And an insulator film 802 is placed on the metal ring 812, and over the insulator film 802 a wiring pattern 803 is formed.

Further, the wiring pattern 803 is covered with a cover insulator film 806 over its entire back surface except a plurality of so-called land portions where solder bump contacts 805 are formed and a plurality of so-called stitch portions which are to be used for the purpose of wire bonding. The metal substrate 801 is exposed at a portion (usually called a device hole) where a silicon chip 807 is to be loaded; the silicon chip 807 is bonded to such portion using a mount 808. Then electrodes of the silicon chip 807 are connected with one end of the wiring pattern 803 by bonding wires 809. Finally the silicon chip 807 and the bonding wire 809 as well as their neighborhood are sealed with seal resin 810.

FIG. 13 of the accompanying drawings is a schematic cross-sectional view of a semiconductor device disclosed in a monthly semiconductor device technology magazine "NIKKEI MICRODEVICE JUNE 1995", pp. 61–65 (an article entitled "Packaging Technology" [literally translated] and written by H. Asakura), published by NIKKEI Business Publication, Inc., Tokyo, Japan. This known technology is hereinafter called the second conventional art.

In the second conventional art, a wiring pattern 903 is formed over an insulator film 902, and electrodes of a silicon chip 907 are bonded to one end of the wiring pattern 903. The insulating film 902 is locally cut out at a device hole where the silicon chip 907 is to be loaded. And the wiring pattern 903 is covered with a cover insulator film 906 over its entire back surface except a plurality of land portions where solder bump contacts 905 are to be formed and a plurality of stitch portions where the electrodes of the silicon chip 907 are to be bonded to the one end of the wiring pattern 903. To maintain the flatness of a prospective package, a support ring 913 is mounted on an outer periphery of the package. Finally the silicon chip 907 and its neighborhood as well are sealed with seal resin 910.

Another conventional technology on BGA is disclosed in a thesis "BGA Market Outlook" presented by TechSearch International, Inc. in "Area Array Packaging Seminar", which was held Dec. 1, 1995 at Waseda University in Tokyo, Japan under the cosponsorship of Circuit Package Society of Japan, Waseda University, Tokyo, Japan, and TechSearch International, Inc., Austin, Texas, U.S.A.. This known technology is hereinafter called the third conventional art and will now be described with reference to FIG. 14 of the accompanying drawings of the present specification.

As shown in FIG. 14, to obtain a flexible substrate, a pair of wiring patterns 1003 laid over opposite sides of an insulator film 1002 are interconnected via through holes 1014; a silicon chip 1007 is connected to one end of the wiring pattern 1003 on one side by a C4 (control collapsed chip connection) bump contact 1007a. In view of its easy handling and flatness, this flexible substrate is stuck at its periphery to a stiffener 1016 with adhesive 1017. Yet in view of heat-radiation property of the silicon chip 1007, the back surface of the silicon chip 1007 and the stiffener 1016 as well are stuck to a heat spreader 1001 with thermal-conductive adhesive 1015. On the wiring pattern 1003 on the other side, which pattern is not connected with the silicon chip 1007, a solder bump contact 1005 is formed to secure an electrical connection with the exterior. Finally the spacing between the silicon chip 1007 and the substrate is sealed with underfill resin 1010.

However, according to the first conventional art of FIG. 12, since the whole BGA is covered with the metal substrate, it is impossible to visually inspect the status of formation of the solder bump contacts after this semiconductor device has been loaded on the substrate to complete the package, so package inspection can no longer be performed. The same may be said of the third conventional art of FIG. 14, in which the whole package is covered with the heat spreader.

Again in the first conventional art, there is a difference in coefficient of thermal expansion between the material to be used as the substrate and the metal to be used in the package and therefore a thermal stress exerts on the solder bump contacts due to the variation of temperature. As a result, the solder bump contacts would be depleted with the lapse of time to cause only a limited reliability of mounting the package onto the mother board.

Further, in each of the first to third conventional arts, since the metal substrate, the heat sink, the stiffener and the support ring are stuck one by one to the wiring pattern in individually processed form, handling would be meticulous and the number of process steps and parts would be increased, thus increasing the cost of production.

Still further, in the second conventional art, it would be difficult to efficiently radiate heat that has been generated in the silicon chip. Furthermore, since only the wiring pattern is a conductive layer, it would also be difficult to realize stabilized signal wiring and reduction of possible noises by stabilizing either the ground wiring or the power supply wiring mechanically.

SUMMARY OF THE INVENTION

With the foregoing problems in view, it is an object of the present invention to provide a semiconductor device structure which is high in efficiency of heat radiation and stabilizes the ground (or power supply) wiring mechanically and which enables visual inspection of the state of packaging, thus improving the reliability of mounting the package onto the mother board and hence lowering the manufacturing cost.

According to the present invention, the above object is accomplished by a semiconductor device comprising: a metal base substrate; an insulator film attached to a back surface of the metal base substrate; a wiring pattern of metal foil formed over a lower surface of the insulator film; a silicon chip whose electrodes are connected to one end of the wiring pattern; and one or more external terminals formed on the other end of the wiring pattern; the metal base substrate having one or more hollows located just above the external terminals.

With this structure, since the metal base substrate has hollows in local portions just above the external terminals (e.g. solder bump contacts), it is possible to expose the surface of the insulator film to these hollows. It is therefore possible to confirm through the insulator film the status of connection of the solder bump contacts located beneath the insulator film.

Further, partly since the solder bump contacts are formed on the metal-foil wiring pattern disposed on the side remote from this exposed insulator and partly since the insulator film is formed of usually polymer resin such as polyamide, which gives a high-temperature dielectric with strong mechanical stability and electrical properties over a wide temperature range, the solder bump contacts serving as external terminals are supported along their peripheries by the flexible insulator film so that, after completion of wiring, possible thermal stresses occurring would be absorbed in the flexible film, thus easing the stress presumably acting on the joints with respect to the solder bump contacts.

Still further, since the three-layer substrate composed of the metal base substrate, the insulation film and the metal foil and is fabricated by patterning using chemical etching and by treating the via holes with metal plating to make them conductive, the fabrication of the semiconductor device of the present invention does not require a process step of sticking a stiffener or a support ring, which has been essential to the conventional art.

Furthermore, partly since the silicon chip is mounted directly on the metal base substrate and partly since the metal base substrate can be maintained in ground potential, it is possible to realize a short heat-radiation path and excellent thermal conductivity, thus lowering the thermal resistance and hence improving the electrical parameters.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

The principles of the present invention are particularly useful when applied to a BGA.

Figure 1:
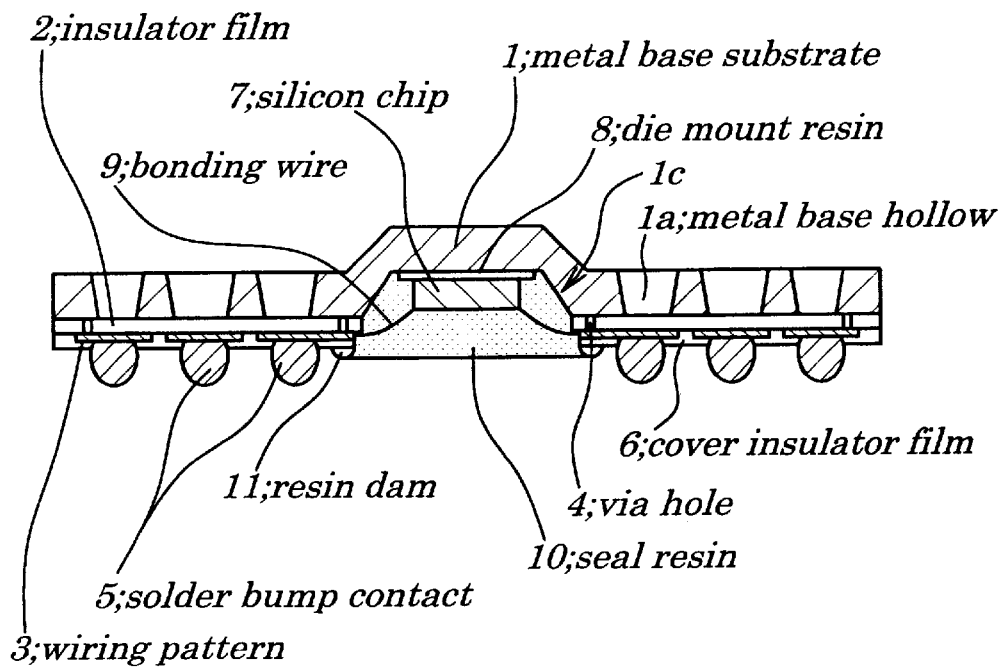
FIG. 1 is a schematic cross-sectional view of a semiconductor device typically embodying the present invention.

FIG. 1 is a schematic cross-sectional view of a semiconductor device embodying the present invention. As shown in FIG. 1, a metal base substrate 1 has centrally in its back surface an upwardly bulged cavity 1c serving as device hole, in which a silicon chip 7 is to be loaded. The metal base substrate 1 is bulged centrally on its back surface in such manner that the device hole (1c) has a depth equal to or larger than the thickness of the silicon chip 7. An insulator film 2 of, for example, polyimide is formed on the metal base substrate 1 over the entire back surface except the device hole 1c, and over a back (lower) surface of the insulator film 2, a wiring pattern 3 of, for example, copper foil is formed. And the wiring pattern 3 has in predetermined positions via holes 4 each for electrical conduction between a specified section of the wiring pattern 3 and the metal base substrate 1.

On the wiring pattern 3, a plurality of solder bump contacts 5 which serve as external terminals are formed. The wiring pattern 3 is covered by a cover insulator film 6 of, for example, organic resin over its entire back (lower) surface except a plurality of land portions where the solder bump contacts 5 are formed and a plurality of stitch portions to which bonding wires 9 are to be respectively connected.

The metal base substrate 1 is locally cut out so as to form a plurality of hollows 1a located just above the corresponding solder bump contacts 5. As a result, the insulation film 2 is exposed to these hollows 1a so that the wiring pattern 3 and the solder bump contacts 5, which are located beneath the hollows 1a, can be seen through the hollows 1a, thus realizing visual inspection of the status of connection of the solder bump contacts 5.

In the device hole 1c of the metal base substrate 1, the silicon chip 7 is loaded, being held in position by a die mount resin 8, such as silver paste. Electrodes of the silicon chip 7 are electrically connected with the respective predetermined sections of the wiring pattern 3 by the corresponding bonding wires 9. The silicon chip 7 and the bonding wires 9 are sealed with seal resin 10. Any resin flow is halted by a resin dam 11 formed around the seal resin 10.

Various modifications or changes may be made to the foregoing structure. The silicon chip 7 may be a flip chip type; in this case, the insulator film 2 and the wiring pattern 3 have to be extended into the device hole 1c. Nonetheless, even using the wire bonding method, the insulating film 2 and the wiring pattern 3 may yet be extended into the device hole 1c so that the wires 9 can be bonded to the wiring pattern 3. Alternatively, instead of providing a recessed device hole, a flat package may be formed to receive the silicon chip on a flat surface. As another alternative, instead of die-bonding the silicon chip to the metal base substrate, an island of copper foil may be formed on the insulation film so that the silicon chip can be die-bonded to the island.

Further, the metal base hollows 1a may be formed one for each solder bump contact 5 or may be a single shared hollow common to a plurality of solder bump contacts 5. Instead of the solder bump contacts 5, the external terminals may be an alternative conductive material such as copper balls.

Various preferred embodiments of the present invention will now be described in detail with reference to FIGS. 2 to 11.

First Embodiment

Figure 2:
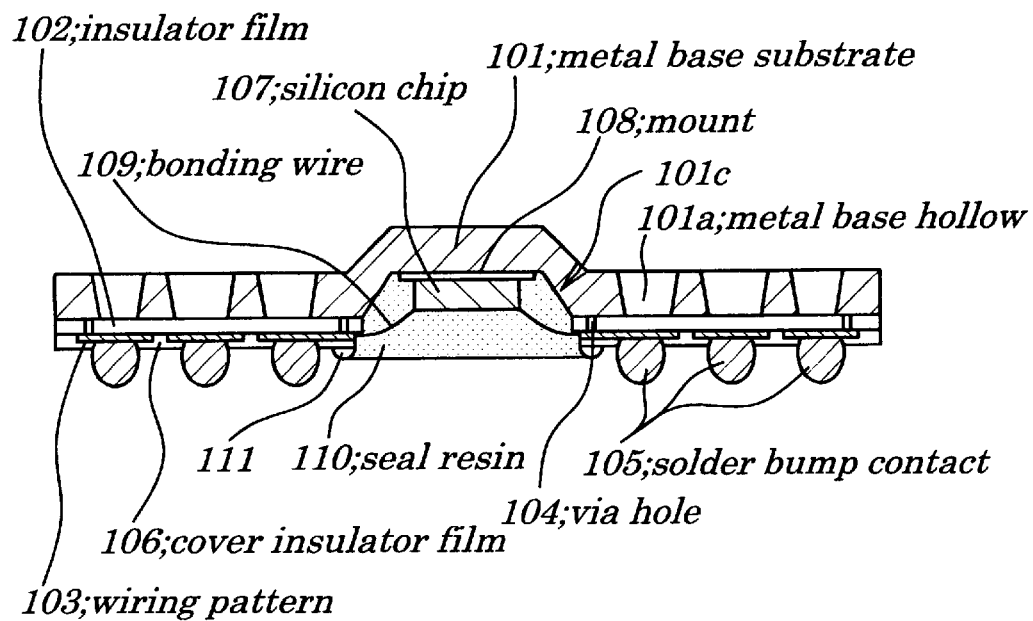
FIG. 2 is a schematic cross-sectional view of a semiconductor device according to a first embodiment of the invention.
Figure 3:
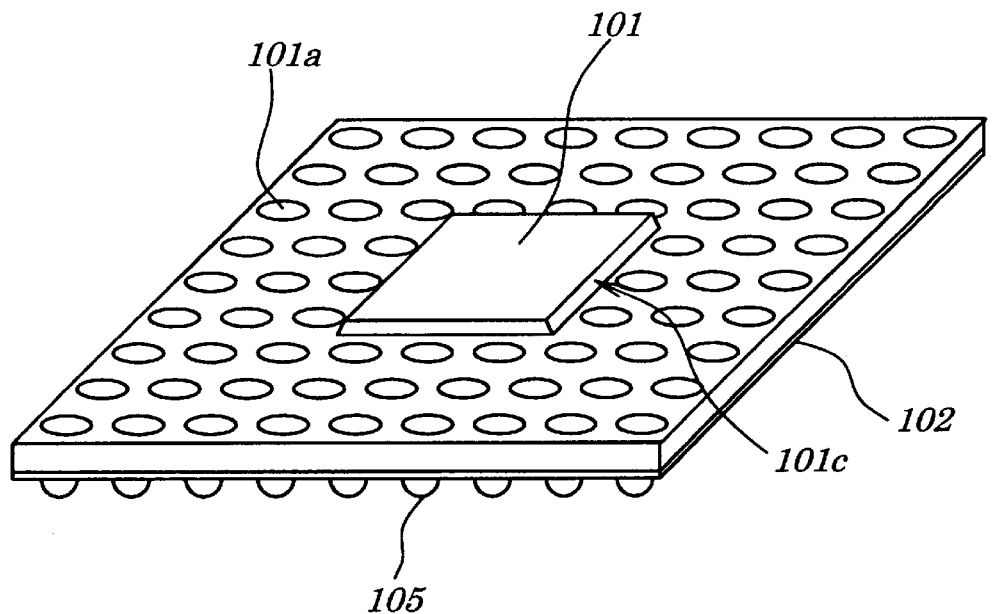
FIG. 3 is a schematic perspective view of the semiconductor device of the first embodiment.

FIG. 2 is a schematic cross-sectional view of a semiconductor device according to a first embodiment of the present invention, and FIG. 3 is a schematic perspective view of the semiconductor device of the first embodiment. As shown in FIGS. 2 and 3, a 0.15–0.25 mm thick metal base substrate 101 of copper is dimpled centrally on its back (lower) surface to form a 0.35–0.60 mm depth cavity (101c) as an upwara silicon chip is to be n which a silicon chip is to be loaded. A 20–55 µm thickness insulator film 102 is formed on the metal base substrate 101 from polyimide, gives a high-temperature dielectric with strong mechanical stability and electrical properties over a wide temperature range, over its entire back (lower) surface except the dimpled portion (cavity) 101c. Over the entire back (lower) surface of the insulator film 102, an 18–35 µm thick copper foil of wiring pattern 103 is formed. And via holes 10 are formed in the wiring pattern 103 at predetermined positions for electrical conduction between a specified part of the wiring pattern 103 and the metal base substrate 101 via the corresponding via hole 104. For formation of the individual via hole 104, a 0.1–0.3 mm diameter hole is formed through the wiring pattern 103 and the insulator film 102 and then the hole wall is plated with copper.

On land portions of the wiring pattern 103, a plurality of solder bump contacts 105, which serve as external terminals, are each formed using a solder ball. The wiring pattern 103 is covered with a cover insulator film 106 of organic resin over its entire back surface except the land portions where the solder bump contacts 105 are formed and the stitch portions where the respective parts of the wiring pattern 103 are connected to the silicon chip 107 by bonding wires 109.

Further, the metal base substrate 101 is cut out at local areas just above the solder bump contacts 105 to form a plurality of 0.4–0.9 mm diameter hollows 101a to which the insulator film 102 is exposed. These hollows 101a are arranged in a two-dimensional matrix through the substantially entire area of the metal base substrate 101. These hollows 101a may be formed by pressing or chemical etching; using chemical etching, it is possible to form these hollows 101a after the insulator film 102 and the copper foil (103) have been laminated over the back surface of the metal base substrate 101.

Then the silicon chip 107 is seated on the bottom of the cavity of the metal base substrate 101 and is fixed in position by a mount 108 as of silver paste. Electrodes of the silicon chip 107 and the wiring pattern 103 are electrically interconnected by the bonding wires 109. The silicon chip 107 and the bonding wires 109 are sealed with seal resin 110 by potting epoxy resin. By the time when this sealing is carried out, to halt any resin flow, a resin dam 111 is formed on a back (lower) surface of the cover insulation film 106 around the seal resin 110.

As an alternative to the sealing method, the transfer mold method may be used.

Second Embodiment

Figure 4:
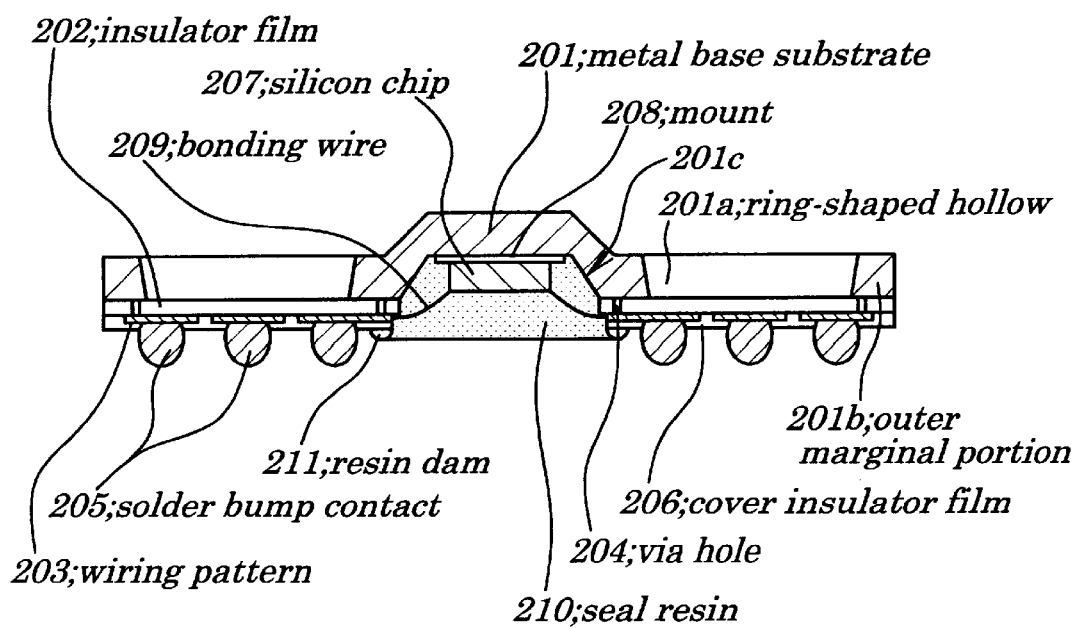
FIG. 4 is a schematic cross-sectional view of a semiconductor device according to a second embodiment.
Figure 5:
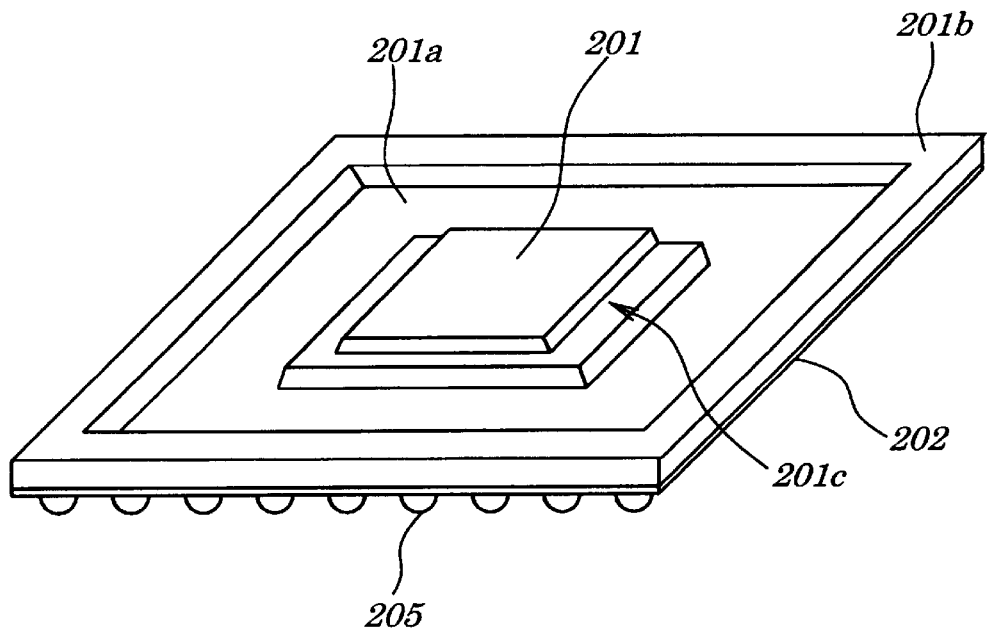
FIG. 5 is a schematic perspective view of the semiconductor device of the second embodiment.

FIG. 4 is a schematic cross-sectional view of a semiconductor device according to a second embodiment, and FIG. 5 is a schematic perspective view of the semiconductor device of the second embodiment. In FIGS. 4 and 5, parts or elements similar to those of the first embodiment of FIGS. 2 and 3 are only designated by the reference numbers or alphanumeric characters whose rightmost and second rightmost digits in decimal notation are common with those in FIGS. 2 and 3, and repetition of their description is omitted here.

In this embodiment, as shown in FIGS. 4 and 5, a metal base substrate 201 is selectively cut out by chemical etching with leaving unetched the dimpled portion (cavity) 201c and an outer marginal portion 201. The size of this dimple portion 201c covers a complete range of the size of the silicon chip 207 with a 2–6 mm allowance, and the outer marginal portion 201b has a width of approximately 1 mm. The metal base substrate 201 is cut out to form a rectangular ring-shaped hollow 201a. This continuous ring-shaped hollow 201a extends over a much wider area to expose the insulator film 202 to a much further extent so that the wiring pattern 203 and the solder bump contacts 205 beneath the ring-shaped hollow 201a can be visually inspected with ease. Furthermore, for the same reason, the semiconductor device of this embodiment is fairly reduced in weight compared to that of the first embodiment.

Third Embodiment

Figure 6:
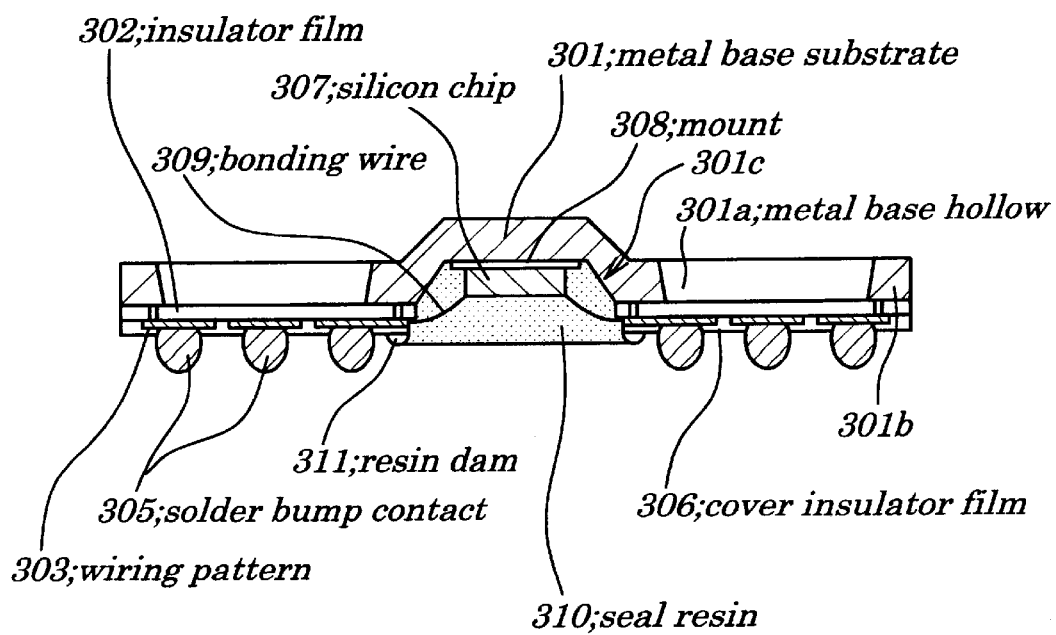
FIG. 6 is a schematic cross-sectional view of a semiconductor device according to a third embodiment.
Figure 7:
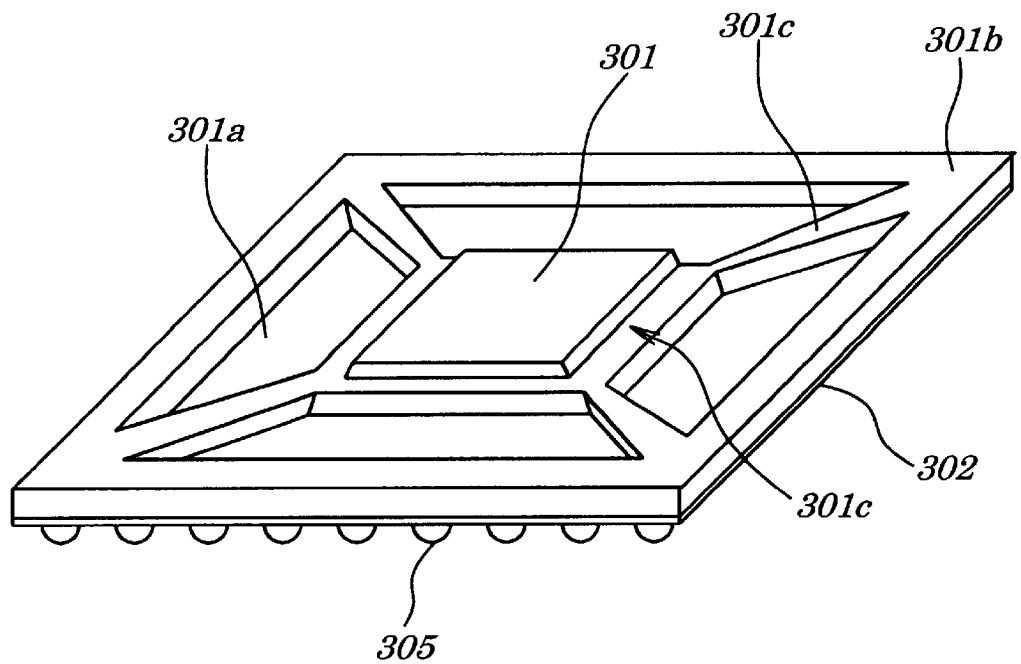
FIG. 7 is a schematic perspective view of the semiconductor device of the third embodiment.

FIG. 6 is a schematic cross-sectional view of a semiconductor device according to a third embodiment, and FIG. 7 is a schematic perspective view of the semiconductor device of the third embodiment. In FIGS. 6 and 7, parts or elements similar to those of the second embodiment of FIGS. 4 and 5 are only designated by the reference numbers or alphanumeric characters whose rightmost and second rightmost digits in decimal notation are common with those in FIGS. 4 and 5, and repetition of their description is omitted here.

In this embodiment, unlike the second embodiment, a metal base substrate 301 has a suspension-type structure in which a central rectangular dimpled portion 301c and an outer marginal portion 301b are interconnected by a four-bridge pattern 301c. The four bridges spans from the four corners of the central rectangular dimpled island (301c) to the four corners of the rectangular outer marginal portion 301b. The size of this rectangular dimple portion 301c covers a complete range of the size of the silicon chip 307 with a 2–6 mm allowance. The outer marginal portion 201 has a width of approximately 1 mm, and each bridge of the four-bridge pattern 301c has a width of 0.1–5 mm. Having this four-bridge pattern 301c, the semiconductor device of this embodiment is improved in mechanical strength of the whole package compared to that of the second embodiment.

Further, since the four-bridge pattern 301c and the wiring pattern 303 are interconnected by via holes, the semiconductor device structure of this embodiment has an increased degree of freedom in designing of the ground wiring pattern. The number and location of the bridges should by no means be limited to the illustrated example and may be changed selectively to meet the uses.

Fourth Embodiment

Figure 8:
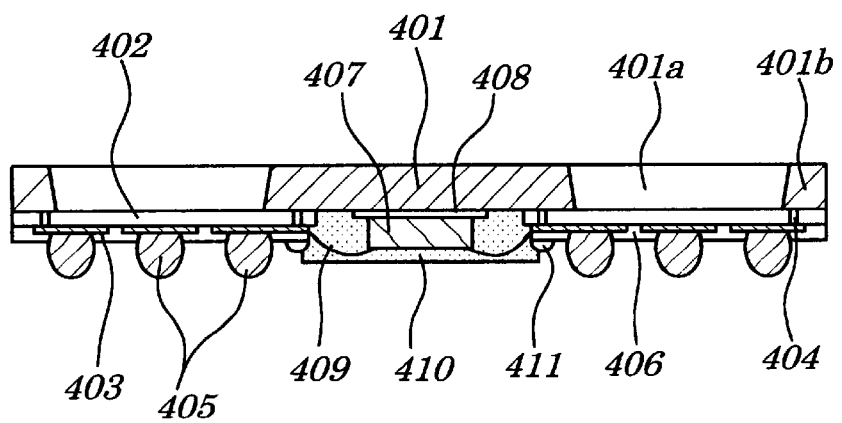
FIG. 8 is a schematic cross-sectional view of a semiconductor device according to a fourth embodiment.

FIG. 8 is a schematic cross-sectional view of a semiconductor device according to a fourth embodiment. In FIG. 8, parts or elements similar to those of the second and third embodiments of FIGS. 4 to 7 are only designated by the reference numbers or alphanumeric characters whose rightmost and second rightmost digits in decimal notation are common with those in FIGS. 4 to 7, and repetition of their description is omitted here. The semiconductor device of this embodiment is identical in structure with the second and third embodiments except that a metal base substrate 401 is not dimpled and has a flat back or lower surface (front or upper surface also is flat) on which a silicon chip 407 is supported.

Fifth Embodiment

Figure 9:
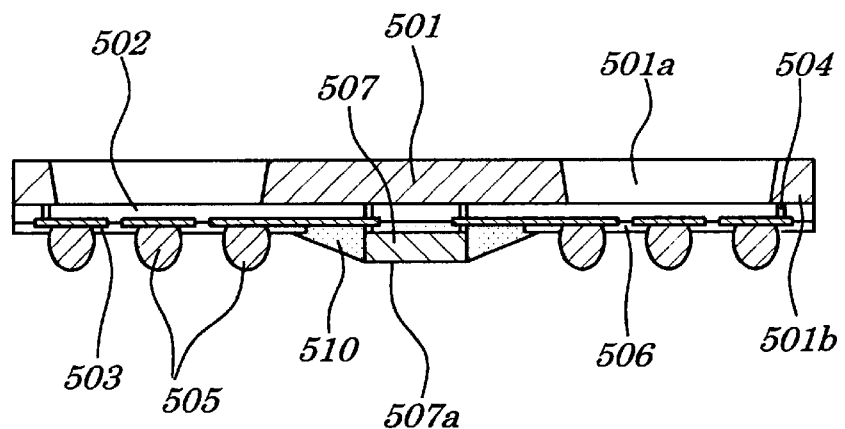
FIG. 9 is a schematic cross-sectional view of a semiconductor device according to a fifth embodiment.

FIG. 9 is a schematic cross-sectional view of a semiconductor device according to a fifth embodiment. In FIG. 9, parts or elements similar to those of the second and third embodiments of FIGS. 4 to 8 are only designated by the reference numbers or alphanumeric characters whose rightmost and second rightmost digits in decimal notation are common with those in FIGS. 4 to 8, and repetition of their description is omitted here. In this embodiment, like the fourth embodiment of FIG. 8, a metal base substrate 501 supporting a silicon chip 507 has a flat structure. And this embodiment is differentiated over the fourth embodiment is that the insulator film 502 is left uncut out at the silicon-chip-loading portion where a silicon chip 507 is connected in a flip-chip form to the wiring pattern 503. Specifically, to the wire pattern 503 extended onto the insulator film 502, conductive bump contacts 507a formed on the silicon chip 507 as mounting pads are bonded, with the silicon chip 507 turned face-down, which bonding method is called face-bonding.

Sixth Embodiment

Figure 10:
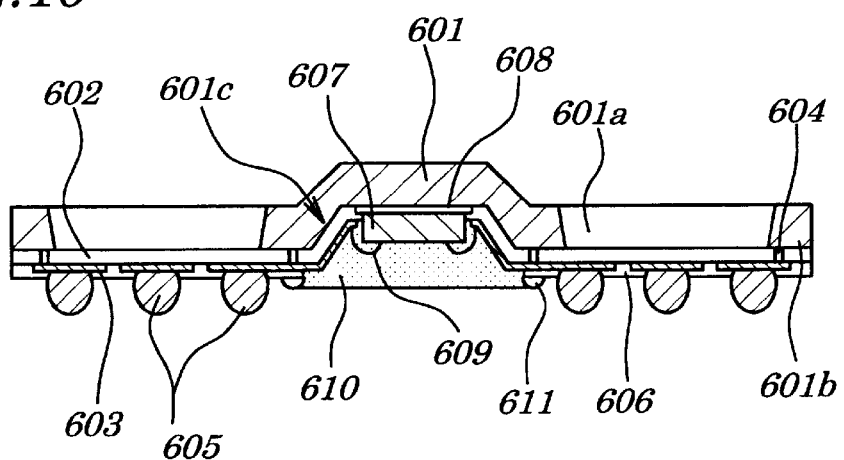
FIG. 10 is a schematic cross-sectional view of a semiconductor device according to a sixth embodiment.

FIG. 10 is a schematic cross-sectional view of a semiconductor device according to a sixth embodiment. In FIG. 10, parts or elements similar to those of the second to fourth embodiments of FIGS. 4 to 7 are only designated by the reference numbers or alphanumeric characters whose rightmost and second rightmost digits in decimal notation are common with those in FIGS. 4 to 7, and repetition of their description is omitted here. The semiconductor device of this embodiment is identical in structure with the second and third embodiments of FIGS. 4 to 7 except that a plurality of stitch portions of the wiring pattern 603 are extended to the bottom of the dimpled portion (cavity serving as a device hole) 601c at which bottom the wire bonding is done. Each of the stitch portions has a width of 60–70 $\mu$m. This dimple or cavity 601c is formed by forcing plastic deformation of the metal base substrate 601, the insulator film 602 and the wiring pattern 603 simultaneously in a non-illustrated die, which process is called drawing press. All of the stitch portions of the wiring pattern 603 may be located at the bottom of the dimple or cavity 601c, or only part of these stitch portions may be extended to the dimple or cavity bottom.

Seventh Embodiment

Figure 11:
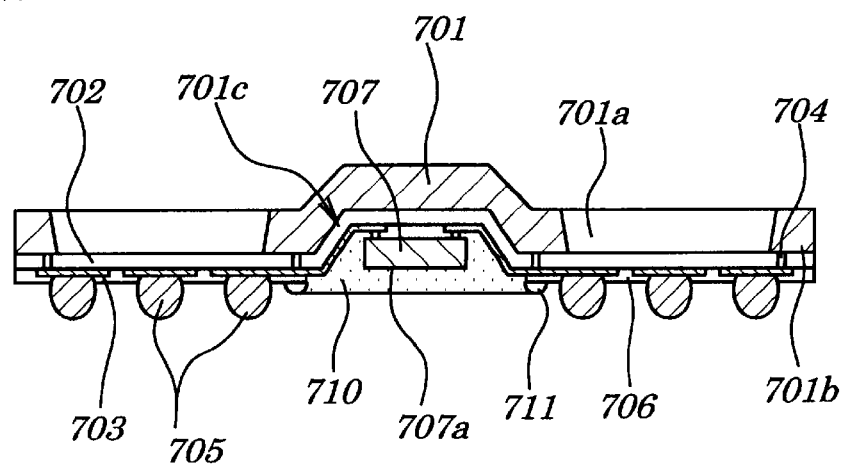
FIG. 11 is a schematic cross-sectional view of a semiconductor device according to a seventh embodiment.
Figure 12:
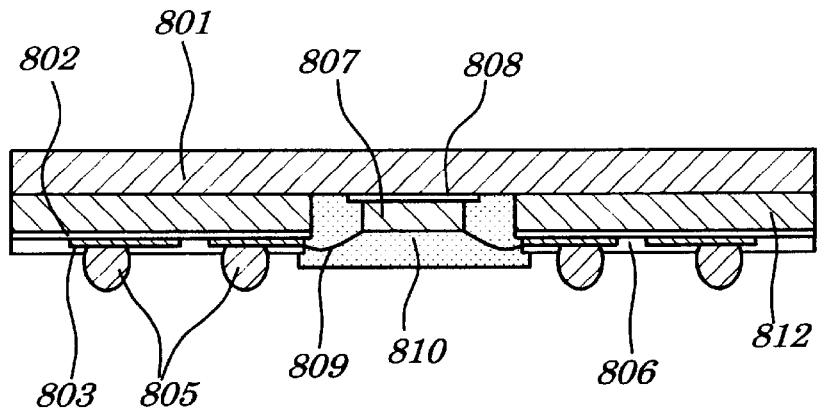
FIG. 12 is a schematic cross-sectional view of a semiconductor device according to a first conventional art.
Figure 13:
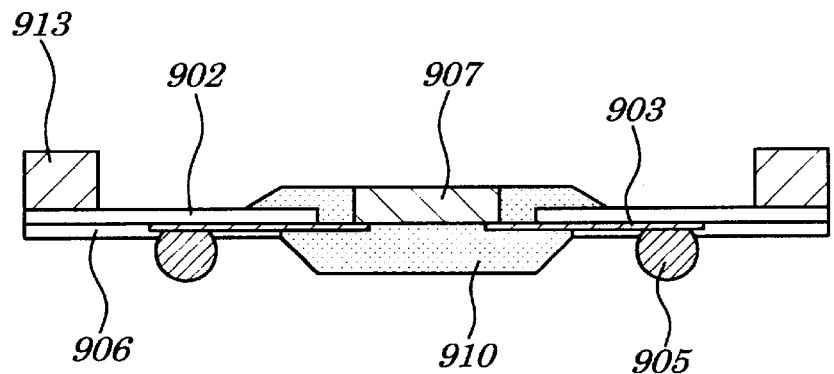
FIG. 13 is a schematic cross-sectional view of a semiconductor device according to a second conventional art.
Figure 14:
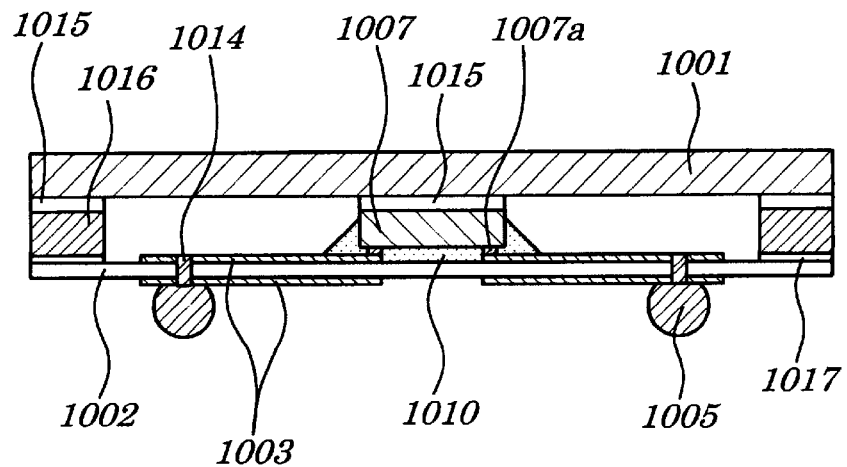
FIG. 14 is a schematic cross-sectional view of a semiconductor device according to a third conventional art.

FIG. 11 is a schematic cross-sectional view of a semiconductor device according to a seventh embodiment. In FIG. 11, parts or elements similar to those of the second to sixth embodiments of FIGS. 4 to 10 are only designated by the reference numbers or alphanumeric characters whose rightmost and second rightmost digits in decimal notation are common with those in FIGS. 4 to 10, and repetition of their description is omitted here. The semiconductor device of this embodiment is identical in structure especially with that of the fifth embodiment of FIG. 9 except that a metal base substrate 705 is dimpled to form an upwardly bulged central cavity (701c) as a device hole in which a flip-chip-type silicon chip 707 is loaded.

In this embodiment, a 60–75 $\mu$m width wiring pattern 703 extends to the bottom of the dimple or cavity (701c) of a 0.3–0.6 $\mu$m thickness metal base substrate 701; this dimpled portion 701c is formed by forcing plastic deformation of the metal substrate 701 and the insulating film 702 and the wing pattern 703 simultaneously in a die, i.e., by drawing press. One end of the respective part of the wiring pattern 703 is extended to the flat bottom surface of the cavity 701c to which bottom surface the silicon chip 707 is bonded. And conductive bump contacts 707a are formed on the silicon chip 707.

In the fifth and seventh embodiments, as shown in FIG. 9 and 11, the conductive bump contacts 507a, 707a are formed on the silicon chip 507, 707 as mounting pads. Alternatively, in either embodiment, the conductive bump contacts 507a, 707a may be formed on the wiring patter 503, 703 with electrodes of the silicon chip 507, 707 bonded to the conductive bump contacts 507a, 707a.

According to the semiconductor device of the present invention, partly since the insulator film and the wiring pattern are laid over the metal base substrate and partly since the metal base substrate is cut out only at areas just above the land portions where the external terminals of the wiring pattern are formed, it is possible to visually inspect the status of connection of the external terminals to the metal base substrate through the insulator film. Further, since the outer marginal portion of the wiring pattern on which the external terminals are formed are supported by the flexible insulation film, possible thermal stresses presumably occurred due to the difference in coefficient of thermal expansion between the substrate entity and the package would be absorbed by the insulating film. Therefore it is possible to ease thermal stresses exerted on the joints of external terminals, thus improving the reliability of wire bonding.

It is thus apparent that the present invention should by no means be limited to the illustrated embodiment and various modifications and changes may be suggested without departing from the scope and spirit of the invention.

What is claimed is:

1. A semiconductor device comprising:

a metal base substrate;

an insulator film attached to a back surface of said metal base substrate;

a wiring pattern of metal foil on a back surface of said insulator film;

a silicon chip whose electrodes are connected to one end of said wiring pattern; and one or more external terminals formed on the other end of said wiring pattern;

said metal base substrate having one or more hollows extended there through to expose a portion of a front surface of said insulator film in said hollows, said hollows being located above respective ones of said external terminals.

2. A semiconductor device according to claim 1, wherein said silicon ship is die-bonded to said back surface of said metal base substrate with said electrodes connected to said one end of said wiring pattern respectively by a plurality of metal filaments.

3. A semiconductor device according to claim 1, further comprising an island of metal foil formed on said lower surface of said insulator film, said silicon chip being die-bonded to said island with said electrodes connected to said one end of said wiring pattern by a plurality of metal filaments, respectively.

4. A semiconductor device according to claim 1, wherein said silicon chip is a flip chip whose bump contacts connected to said one end of said wiring pattern.

5. A semiconductor device according to claim 1, wherein said metal base substrate has a central device portion bulged upwardly so as to form a cavity receptive of said silicon chip.

6. A semiconductor device according to claim 1, wherein said one or more external terminals is two or more, said one or more hollows of said metal base substrate being a single hollow shared by said two or more external terminals.

7. A semiconductor device according to claim 1, wherein said insulator film has one or more via holes, said metal base substrate being connected to said wiring pattern and maintained in a ground potential.

8. A semiconductor device according to claim 1, further comprising a cover insulator film covering said wiring pattern over its entire area except a plurality of land portions where said external terminals are formed and a plurality of stitch portions to which said electrodes of said silicon chip are respectively connected.

9. A semiconductor device according to claim 1, wherein said one or more hollows are a plurality of hollows arranged in a two-dimensional matrix through a substantially entire area of said metal base substrate.

10. A semiconductor device according to claim 1, further comprising a plurality of solder bump contacts formed on said wiring pattern.

11. A semiconductor device according to claim 1, wherein said metal base substrate has a flat back surface through its entire area.

12. A semiconductor device according to claim 1, wherein said wiring pattern and said silicon chip are interconnected by bonding wires.

13. A semiconductor device according to claim 1, wherein said silicon chip and said bonding wires are sealed with seal resin.

14. A semiconductor device according to claim 2, wherein said metal base substrate has a suspension-type structure with a plurality of bridges each extending between said central device portion and an outer marginal portion of said metal base substrate.

15. A semiconductor device according to claim 14, wherein said insulator film is formed of polyimide.

16. A semiconductor device according to claim 6, wherein said single hollow has a continuous ring shape.

17. A ball grid array comprising:

a metal substrate having opposing first and second surfaces and one or more hollows extending through said substrate between said first and second surfaces;

an insulative film on said first surface of said substrate that is visible through said one or more hollows from said second surface;

a conductive pattern on said insulative film having plural first terminals for connection to an electronic device and plural second terminals that are external connection pads, said plural second terminals being aligned with said one or more hollows; and plural bump contacts, each connected to a different one of said plural second terminals, wherein connections of said bump contacts to said second terminals are examinable through said one or more hollows.

18. The ball grid array of claim 17, comprising a plurality of said hollows that are arranged in a matrix, and wherein each of said second terminals is associated with and aligned with a different one of said plurality of hollows.

19. The ball grid array of claim 17, wherein a plurality of said second terminals are associated with and aligned with a same one of said hollows.

20. The ball grid array of claim 17, wherein a part of said first surface of said substrate is recessed to form an electronic device receiving portion and a corresponding part of said second surface protrudes.

* * * * *